(12) United States Patent
Rao et al.

(10) Patent No.: US 12,267,970 B2
(45) Date of Patent: Apr. 1, 2025

(54) THERMAL DISSIPATION HOLDER

(71) Applicant: ASUSTEK COMPUTER INC., Taipei (TW)

(72) Inventors: Jhih-Wei Rao, Taipei (TW); Zih-Siang Huang, Taipei (TW); Hung-Chieh Wu, Taipei (TW); Liang-Jen Lin, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 194 days.

(21) Appl. No.: 18/154,476

(22) Filed: Jan. 13, 2023

(65) Prior Publication Data
US 2024/0008201 A1    Jan. 4, 2024

(30) Foreign Application Priority Data

Jul. 4, 2022  (TW) .................. 111124984

(51) Int. Cl.
*H05K 7/14* (2006.01)
*G06F 1/20* (2006.01)
(Continued)

(52) U.S. Cl.
CPC .......... *H05K 5/0221* (2013.01); *G06F 1/203* (2013.01); *H05K 7/1401* (2013.01); *H05K 7/2039* (2013.01)

(58) Field of Classification Search
CPC .. H05K 5/0221; H05K 7/1401; H05K 7/2039; G06F 1/203
See application file for complete search history.

(56) References Cited

U.S. PATENT DOCUMENTS

| | | | |
|---|---|---|---|
| 7,017,243 B2 * | 3/2006 | Carnevali | F16M 13/00 |
| | | | 24/523 |
| 8,752,802 B1 * | 6/2014 | Fan | H04M 1/04 |
| | | | 248/316.1 |

(Continued)

FOREIGN PATENT DOCUMENTS

CN    213938018 U    8/2021

OTHER PUBLICATIONS

ASUS Discussion Forum "The Whistleblower brought color rendering figures of ROG Phone 6 and peripheral accessories" retrieved from: ePrice Mobile https://m.eprice.com.tw/mobile/talk/4543/5735067/1, published Jun. 28, 2022, 13 pages.

*Primary Examiner* — Anthony M Haughton
*Assistant Examiner* — Hung Q Dang
(74) *Attorney, Agent, or Firm* — Muncy, Geissler, Olds & Lowe, P.C.

(57) ABSTRACT

A thermal dissipation holder for a handheld electronic device is provided. The thermal dissipation holder includes a main structure, a movable element, an elastic element, and a locker. The main structure has a front surface and a rear surface. The movable element is movably connected to the main structure along a first direction and has a clamp portion at a side away from the carrier. One end of the elastic element is connected to the main structure. The other end of the elastic element is connected to the movable element. The elastic element drives the movable element to move along the first direction. The locker is disposed in the main structure and has a locking portion, where a position of the locking portion corresponds to that of the clamp portion, and the locker is selectively engaged with the clamp portion through the locking portion to lock the movable element.

9 Claims, 12 Drawing Sheets

(51) Int. Cl.
    *H05K 5/02*     (2006.01)
    *H05K 7/20*     (2006.01)

(56) References Cited

U.S. PATENT DOCUMENTS

| | | | |
|---|---|---|---|
| 9,647,712 B2 * | 5/2017 | Ryan | H04B 1/3888 |
| 9,797,543 B2 * | 10/2017 | Lin | F16M 13/00 |
| 9,902,336 B2 * | 2/2018 | Lippold-Fritz | B60R 11/02 |
| 9,924,005 B1 * | 3/2018 | McElderry | H04M 1/04 |
| 10,933,815 B1 | 3/2021 | Khubani et al. | |
| 10,938,815 B2 | 3/2021 | Jain et al. | |
| 11,516,328 B2 * | 11/2022 | Adelman | F16M 13/022 |

* cited by examiner

THERMAL DISSIPATION HOLDER

CROSS-REFERENCE TO RELATED APPLICATION

This application claims the priority benefit of Taiwan Application Serial No. 111124984, entitled "THERMAL DISSIPATION HOLDER" filed on Jul. 4, 2022. The entirety of the above-mentioned patent application is hereby incorporated by reference herein and made a part of the specification.

BACKGROUND OF THE INVENTION

Field of the Invention

The disclosure relates to a thermal dissipation device, and in particular, to a thermal dissipation holder for a handheld electronic device.

Description of the Related Art

With the performance improvement of mobile phones, the heat produced by the mobile phones during operating is increasing. In addition to reducing the service life of the mobile phones, the increase in the heat produced by the mobile phones also affects user experience.

SUMMARY OF THE INVENTION

The disclosure provides a thermal dissipation holder, for a handheld electronic device. The thermal dissipation holder includes a main structure, a movable element, an elastic element, and a locker. The main structure has a front surface and a rear surface, the rear surface has a carrier, and the carrier is applied to carry the handheld electronic device. The movable element is movably connected to the main structure along a first direction and has a clamp portion at a side away from the carrier. One end of the elastic element is connected to the main structure. The other end of the elastic element is connected to the movable element. The elastic element drives the movable element to move along the first direction. The locker is disposed in the main structure and has a locking portion, where a position of the locking portion corresponds to that of the clamp portion, and the locker is selectively engaged with the movable element through the locking portion to lock the movable element.

The thermal dissipation holder provided in the disclosure has a movable element, an elastic element, and a locker. Through the arrangement of the locker and the elastic element, a user simply unlocks the movable element and extend the movable element outward automatically, which is convenient for the user to mount the thermal dissipation holder on the handheld electronic device. After the handheld electronic device is placed and positioned, the user uses the locker to lock the movable element by only pressing the movable element, to mount the thermal dissipation holder stably on the handheld electronic device for operation. In this way, the problem that the traditional thermal dissipation holders are difficult to mount and easy to loose is resolved.

DETAILED DESCRIPTION OF THE EMBODIMENTS

The following describes specific implementations of the disclosure in more detail with reference to drawings. According to the following description and the claims, advantages and features of the disclosure are clearer. It should be noted that, the drawings adopt a simplified form and use a non-precise proportion, and are only used for conveniently and clearly illustrating the embodiments of the disclosure.

Figure 1:
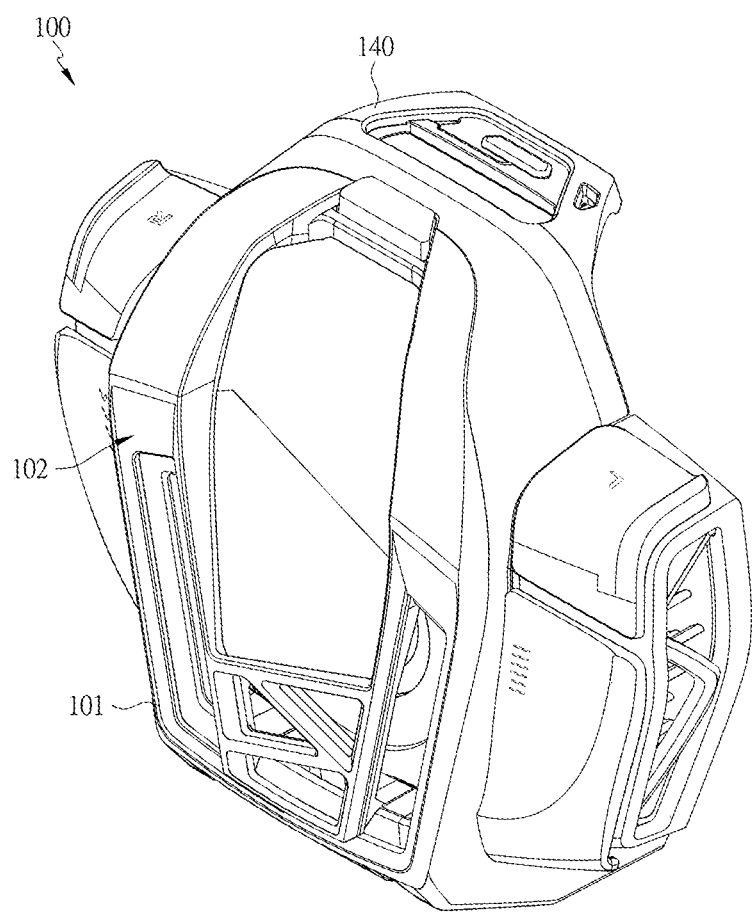
FIG. 1 is a schematic front three-dimensional view of a thermal dissipation holder according to an embodiment of the disclosure.
Figure 2:
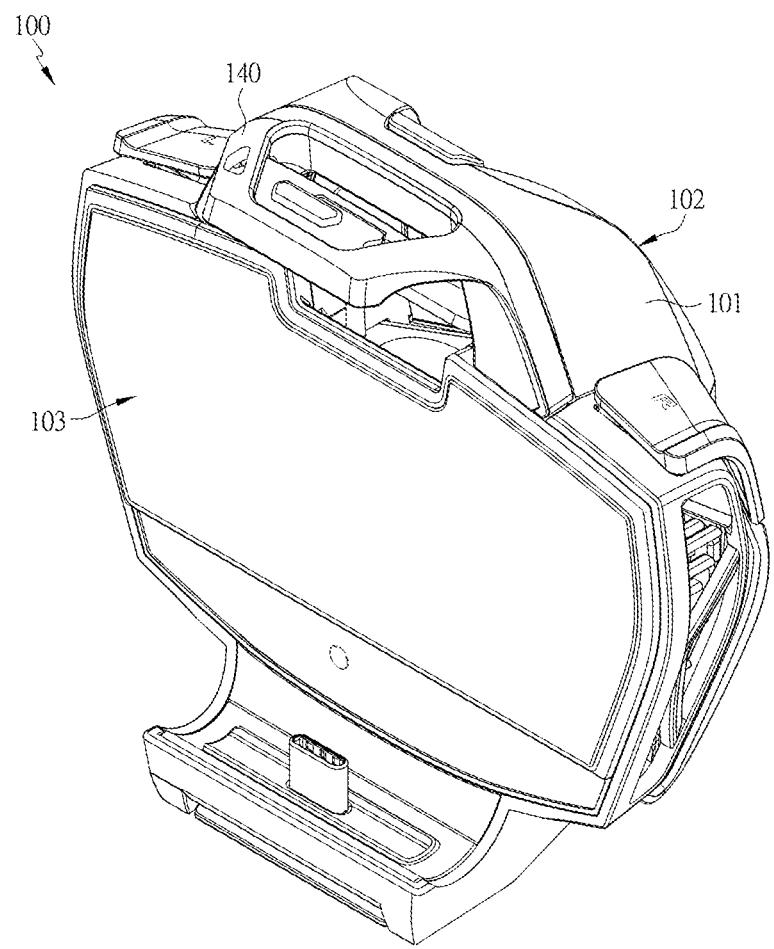
FIG. 2 is a schematic rear three-dimensional view of the thermal dissipation holder in FIG. 1.
Figure 3:
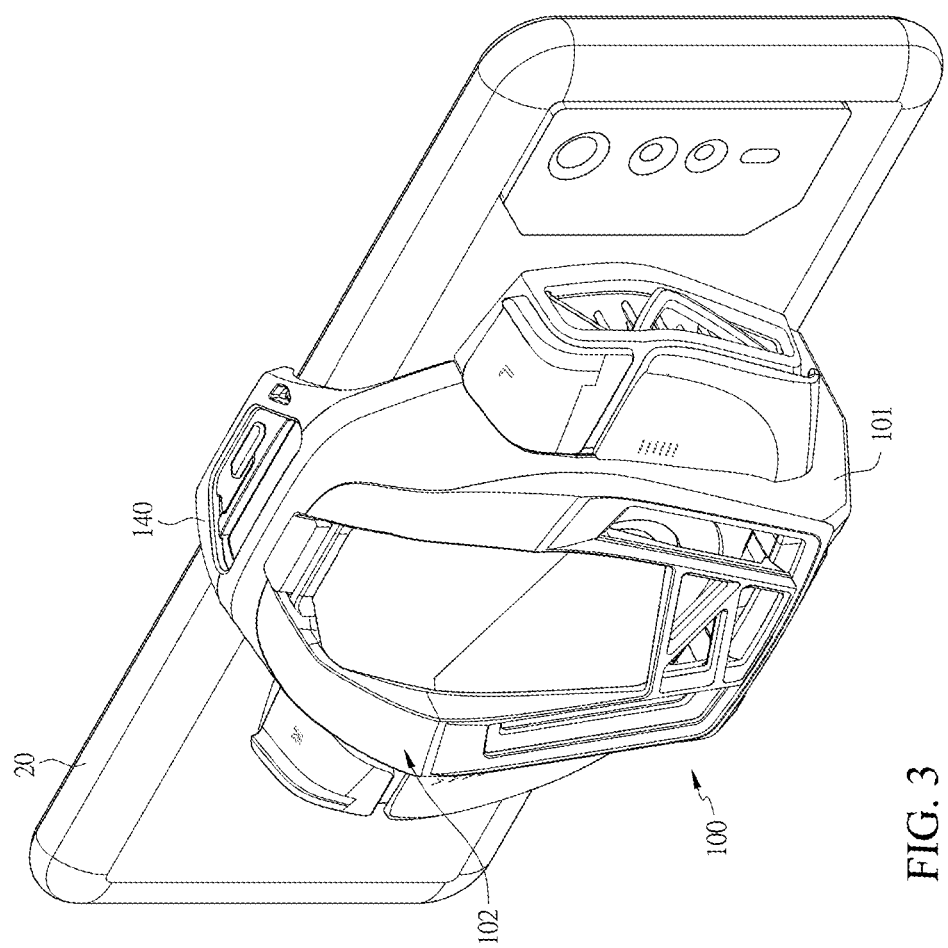
FIG. 3 is a schematic view of the thermal dissipation holder mounted on a handheld electronic device in FIG. 1.
Figure 4A:
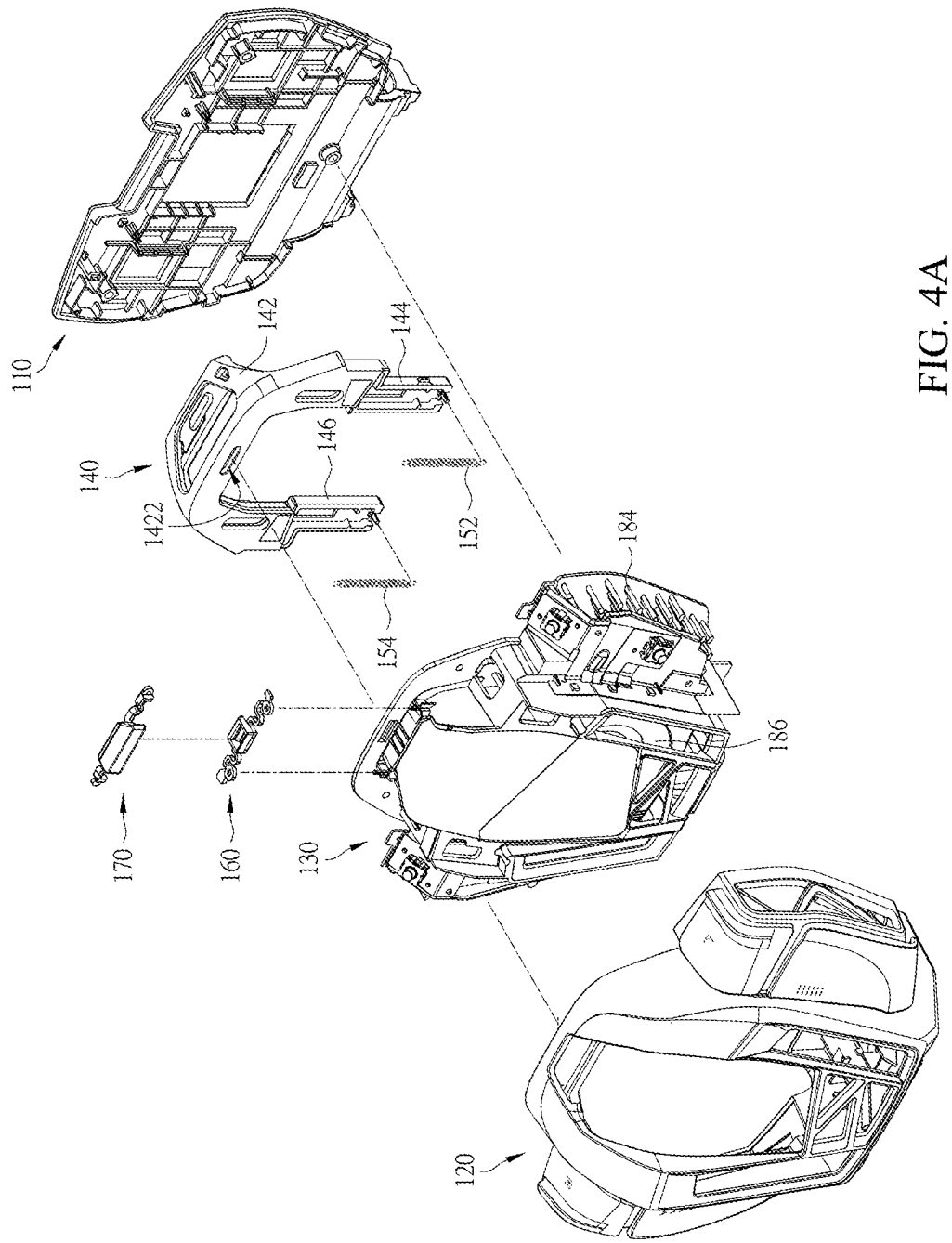
FIG. 4A and FIG. 4B are schematic exploded views of the thermal dissipation holder from different angles of view in FIG. 1.
Figure 4B:
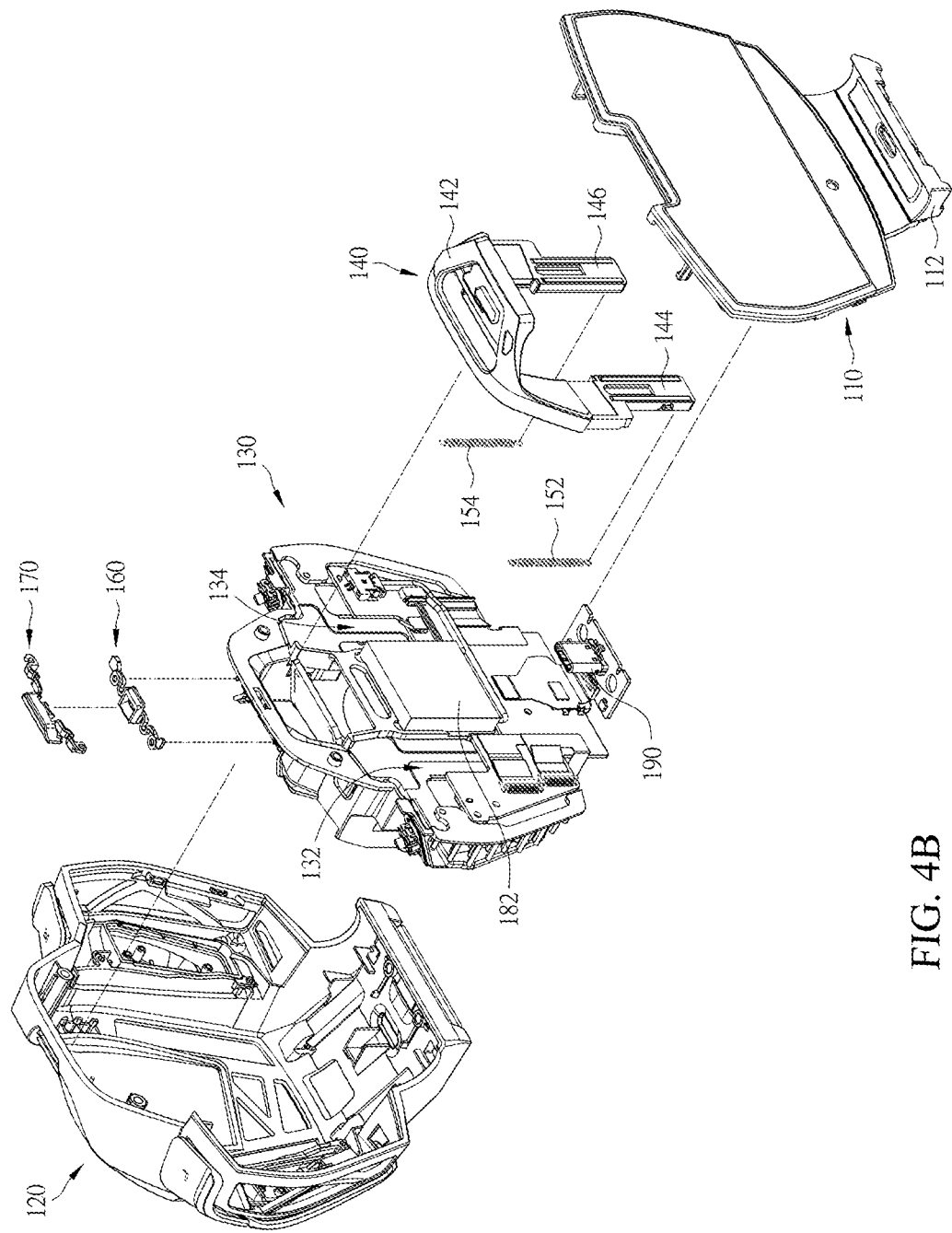

FIG. 1 is a schematic front three-dimensional view of a thermal dissipation holder 100 according to an embodiment of the disclosure; FIG. 2 is a schematic rear three-dimensional view of the thermal dissipation holder 100 in FIG. 1; FIG. 3 is a schematic view of the thermal dissipation holder 100 mounted on a handheld electronic device 20 in FIG. 1; and FIG. 4A and FIG. 4B are schematic exploded views of the thermal dissipation holder 100 from different angles of view in FIG. 1.

Referring to FIG. 3, the disclosure provides a thermal dissipation holder 100, for a handheld electronic device 20. In an embodiment, the handheld electronic device is a smartphone.

Referring to FIG. 1 to FIG. 4B, the thermal dissipation holder 100 includes a main structure 101, a movable element 140, an elastic element 152, an elastic element 154, a locking portion 160, and a key 170.

The main structure 101 is composed of a base 110, a cover 120, and a frame 130. The main structure 101 has a front surface 102 and a rear surface 103. The base 110 is located on the rear surface 103 of the main structure, that is, a side facing the handheld electronic device 20. The cover 120 is integrated with the base 110 to form a space.

A lower side of the rear surface 103 of the main structure 101 has a carrier 112 for abutting against a side surface of the handheld electronic device 20 to carry the handheld electronic device 20.

In an embodiment, the carrier 112 further has a port 190 for being electrically connected to the handheld electronic device 20. The thermal dissipation holder 100 communicates with the handheld electronic device 20 through the port 190 and obtains power through the handheld electronic device 20. In another embodiment, the thermal dissipation holder 100 further communicates with the handheld electronic device 20 in a wireless mode (such as through Bluetooth). In another embodiment, the thermal dissipation holder 100 is a built-in battery, and there is no need to obtain power through the handheld electronic device 20.

The frame 130 is located in the space formed by the base 110 and the cover 120, and is for a thermal dissipation module.

In an embodiment, referring to FIG. 4A and FIG. 4B, the thermal dissipation module includes a thermoelectric cooling chip 182, a thermal dissipation sheet 184, and a fan 186. The thermoelectric cooling chip 182 is disposed at a side of the frame 130 facing the base 110, to dissipate heat for the handheld electronic device 20 through heat conduction. The thermal dissipation sheet 184 is disposed at a side of the thermoelectric cooling chip 182 facing away from the handheld electronic device 20. The fan 186 is disposed on the thermal dissipation sheet 184, to produce an airflow through the thermal dissipation sheet 184, to take away heat produced by operation of the thermoelectric cooling chip 182.

Figure 5:
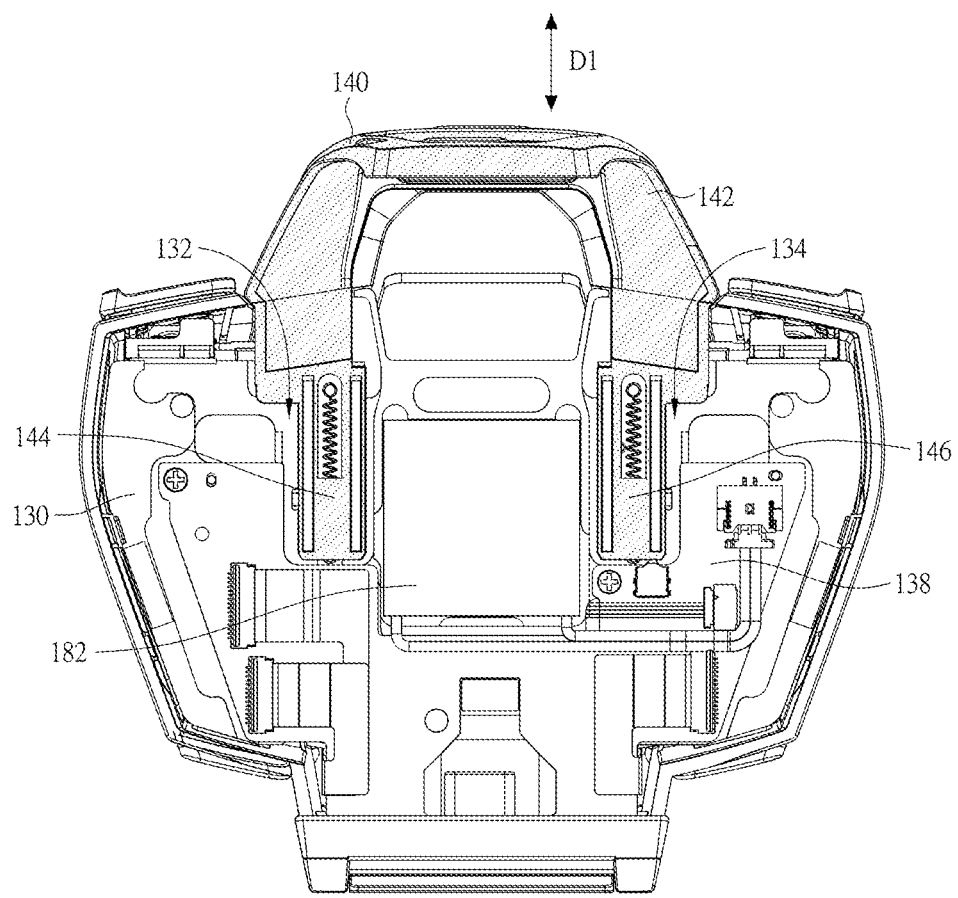
FIG. 5 displays a combination structure of a frame and a movable element.

Referring to FIG. 5 together, the frame 130 has a slide groove 132 and a slide groove 134 extending along the first direction D1 at a side facing the base 110. The slide groove 132 and the slide groove 134 are located at two opposite sides of the thermoelectric cooling chip 182 to prevent an action of the movable element 140 from affecting the configuration of thermal dissipation elements (such as the thermoelectric cooling chip 182) inside the thermal dissipation holder 100.

An upper part of the movable element 140, that is, a side away from the carrier 112, has a clamp portion 142. The clamp portion 142 protrudes toward the direction of the base 110 to hold and fix the handheld electronic device 20 together with the carrier 112. The clamp portion 142 further has a locking opening 1422 clamped in the locker 160.

A lower part of the movable element 140, that is, a side facing the carrier 112, has a sliding portion 144 and a sliding portion 146, sliding into the slide groove 132 and the slide groove 134 respectively. The sliding portion 144 and the sliding portion 146 are located between the base 110 and the frame 130. In this way, the movable element 140 is movably connected to the main structure 101 of the thermal dissipation holder 100 along the first direction D1.

The elastic element 152 and the elastic element 154 are disposed between the frame 130 and the movable element 140, to drive the movable element 140 to move toward a direction away from the carrier 112. In an embodiment, the elastic element 152 and the elastic element 154 are tension springs, upper ends of the elastic element 152 and the elastic element 154 are connected to the base (not shown in the drawing), and lower ends are connected to the sliding portion 144 and the sliding portion 146 of the movable element 140. The elastic element 152 and the elastic element 154 are connected to other components of the main structure 101. In another embodiment, the elastic element 152 and the elastic element 154 are compression springs.

In this embodiment, the elastic element 152 and the elastic element 154 are used together with the sliding portion 144 and the sliding portion 146 of the movable element 140, to produce uniform force to drive the movable element 140 to move along the first direction D1. In another embodiment, only one slide groove 132 is disposed on the frame 130 to increase the configuration space of the thermal dissipation elements. Next, in the disclosure, the slide groove 132 and the slide groove 134 on the frame 130 are used to limit the movement direction of the movable element 140. In another embodiment, the slide groove is disposed on the base 110 to limit the movement direction of the movable element 140.

A bottom end of the slide groove 132 in this embodiment further has a switch unit 138 for determining whether the movable element 140 is pressed and positioned. In an embodiment, the switch unit 138 is disposed on a power supply line of the fan 186. After the movable element 140 is pressed and positioned, the sliding portion 144 presses the switch unit 138 and makes the switch unit 138 switch to an on state. In this case, the power supply line starts to supply power to the fan 186. In this way, the fan 186 is prevented from operating in the mounting process, to ensure that the fan 186 operates normally after mounted correctly by the user, avoiding causing damage.

In another embodiment, the switch unit 138 is disposed on a power supply line of the thermoelectric cooling chip 182 to control to supply or not supply power to the thermoelectric cooling chip 182. In addition, the switch unit 138 is electrically connected to the port 190 to control the handheld electronic device 20 to start or not start to supply power to the thermal dissipation holder 100.

Figure 6:
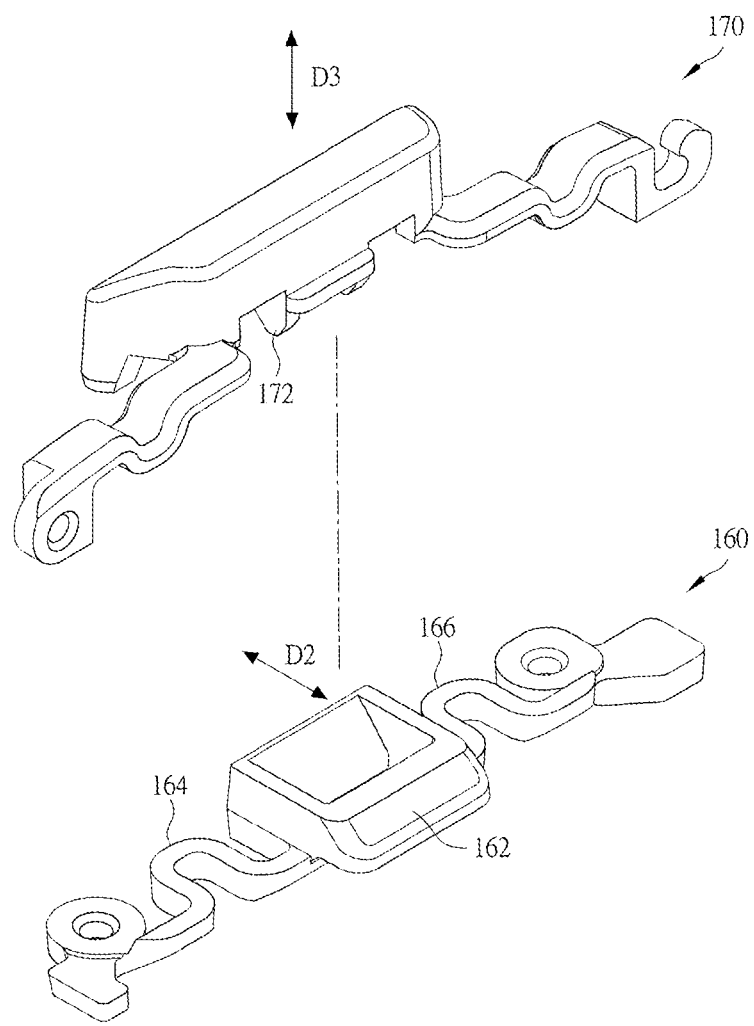
FIG. 6 displays structure details of a locker and a key.
Figure 7:
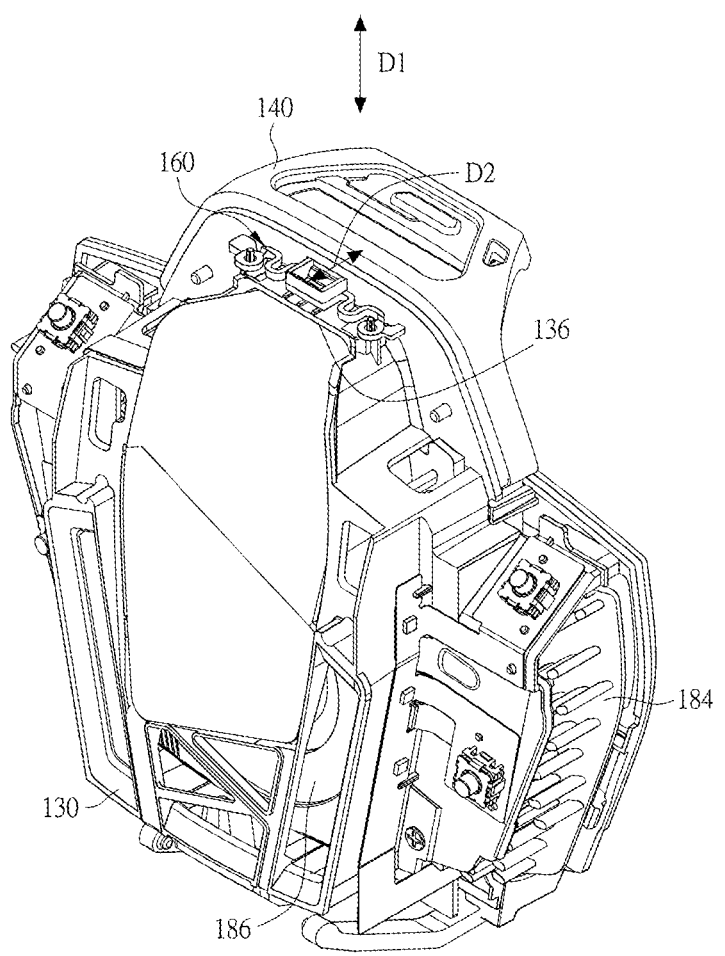
FIG. 7 displays a combination structure of a locker, a frame, and a movable element.

Referring to FIG. 6 and FIG. 7 together, the locker 160 is disposed at a side of the frame 130 facing away the movable element 140, and is selectively engaged with the clamp portion 142 of the movable element 140 to lock the movable element 140.

The locker 160 includes a locking portion 162, an elastic portion 164, and an elastic portion 166. The locking portion 162 is movably disposed on the frame 130 along a second direction D2. A position of the locking portion 162 approximately corresponds to that of the clamp portion 142 of the movable element 140. The locker 160 is selectively inserted the locking opening 1422 of the clamp portion 142 through the locking portion 162 to lock the movable element 140.

The elastic portion 164 and the elastic portion 166 are located at two sides of the locking portion 162, and ends of the elastic portion 164 and the elastic portion 166 away from the locking portion 162 are fixed on the frame 130. The elastic portion 164 and the elastic portion 166 are for driving the locking portion 162 to move toward the clamp portion 142 along the second direction D2.

In an embodiment, the second direction D2 is perpendicular to the first direction D1. In an embodiment, the elastic portion 164 and the elastic portion 166 are wavy structures, which helps produce deformation and provide elastic restoring force. In an embodiment, the frame 130 further has a fastener base 136. The locker 160 is located on the fastener base 136, and two ends of the elastic portion 164 and the elastic portion 166 away from the locking portion 162 are fixed on the fastener base 136.

The key 170 is disposed on the cover 120. The key 170 moves along a third direction D3 to drive the locking portion 162 of the locker 160 to move along the second direction D2. Specifically, a bottom of the key 170 has an abutment surface 172 for abutting against the locking portion 162 of the locker 160 to drive the locking portion 162 to move away from the clamp portion 142 along the second direction D2. In an embodiment, the third direction D3 is perpendicular to the second direction D2.

The key 170 disclosed in this embodiment switches an action along the third direction D3 to an action along the second direction D2 to drive the locking portion 162, which helps the user to operate. In another embodiment, the key 170 is omitted, and instead, the structure of the locking portion 162 is extended to a surface of the cover 120 for the user to operate.

Figure 8A:
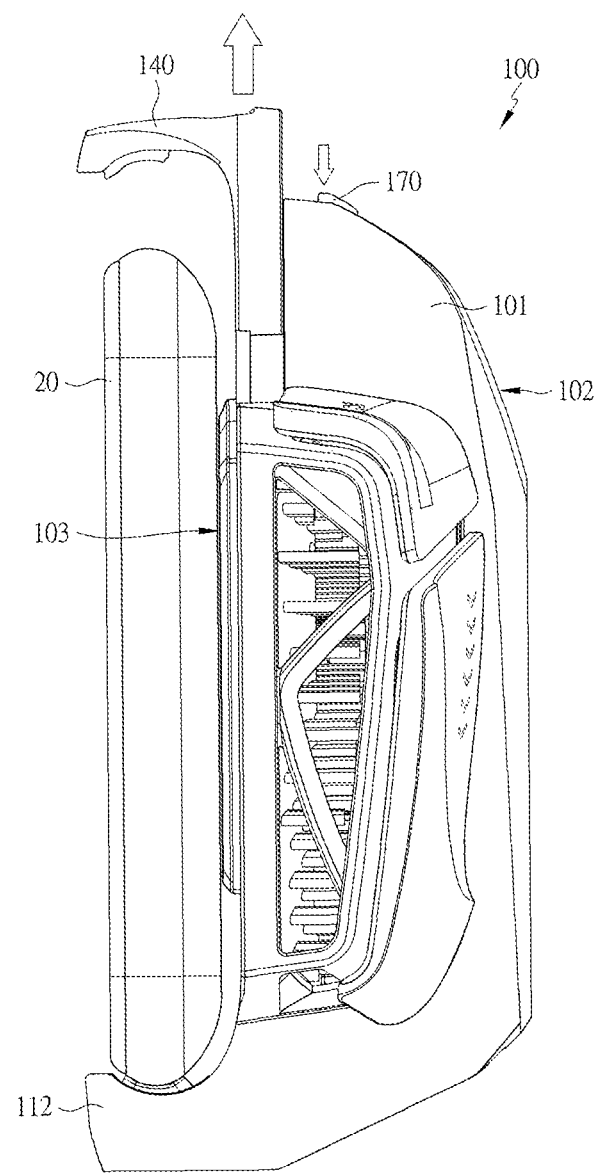
FIG. 8A and FIG. 8B display a process of mounting the thermal dissipation holder in the disclosure on a handheld electronic device.

As shown in FIG. 8A, when the user needs to mount the thermal dissipation holder 100 in the disclosure on the handheld electronic device 20, the user presses the key 170 first to move the locking portion 162 toward a direction away from the movable element 140 and separate from the locking opening 1422. That is, the locking of the locker 160 to the movable element 140 is released.

In this case, the elastic restoring forces of the elastic element 152 and the elastic element 154 drive the movable element 140 to move toward a direction away from the carrier 112 (as shown by an arrow in the drawing), and extend the clamp portion 142 outward. Then, the user positions the handheld electronic device 20 on the carrier 112.

Figure 8B:
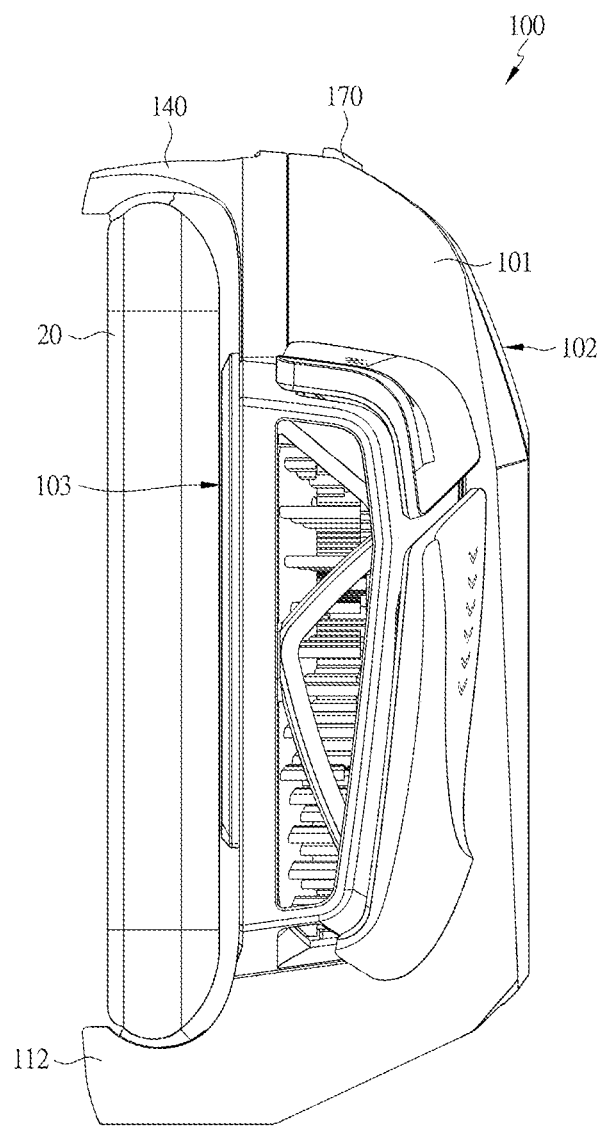

Next, as shown in FIG. 8B, the user presses the clamp portion 142, and moves the movable element 140 toward the direction of the carrier 112 to fix the handheld electronic device 20.

When the movable element 140 is pressed and positioned, the locking portion 162 of the locker 160 is clamped in the locking opening 1422 of the movable element 140 to lock the movable element 140. At the same time, the sliding portion 144 of the movable element 140 also abuts against the switch unit 138, so that the switch unit 138 switches from an off state to an on state, and starts to supply power to the fan 186.

Figure 9A:
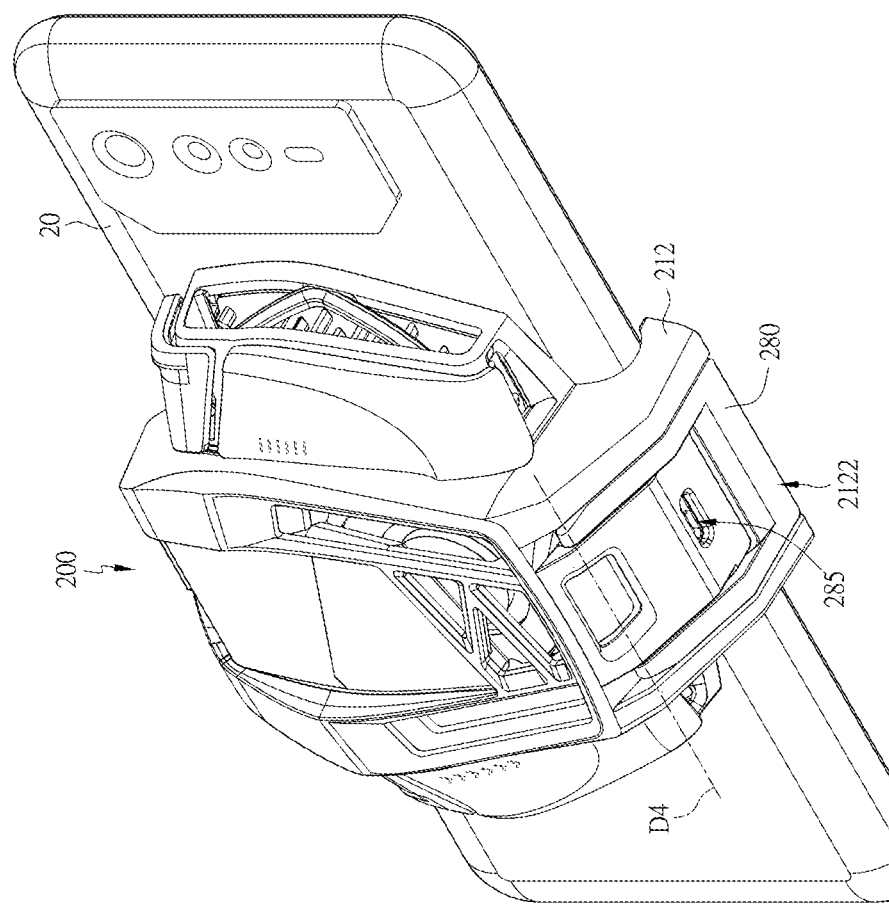
FIG. 9A and FIG. 9B are a schematic view of a thermal dissipation holder according to another embodiment of the disclosure.
Figure 9B:
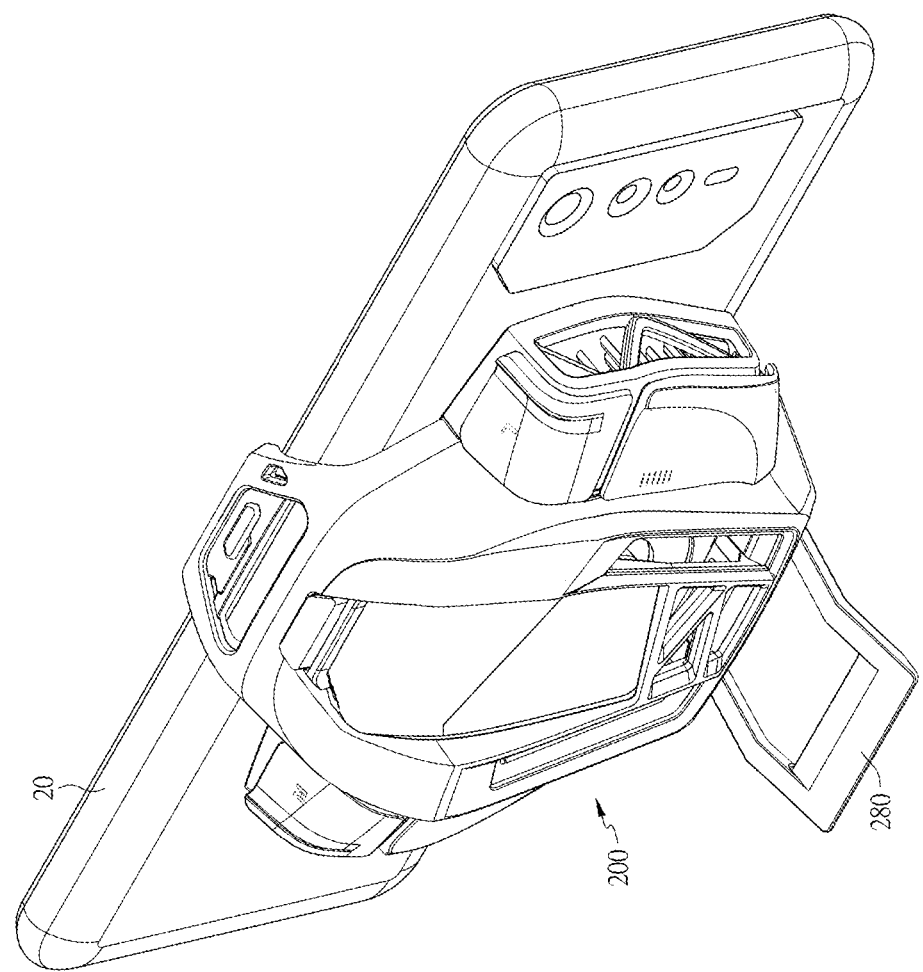

In an embodiment, as shown in FIG. 9A and FIG. 9B, a thermal dissipation holder 200 includes a support member 280. The support member 280 is pivotally connected to the carrier 212 along a rotation axis direction D4, to switch between a folding position (corresponding to FIG. 8A) and a supporting position (corresponding to FIG. 8B). When the support member 280 moves to the supporting position, stable support is provided for the user to place the handheld electronic device 20 on the desktop to view without holding it. In an embodiment, the rotation axis direction D4 is perpendicular to the first direction D1.

In an embodiment, a lower surface of the carrier 212 further has a receiving groove 2122. When the support member 280 is located at the folding position, the support member 280 is received in the receiving groove 2122. In this way, the support member 280 is received at a bottom of the thermal dissipation holder 200 when not needed.

In an embodiment, the lower surface of the carrier 212 further has a plughole 285 for the user to connect to an external power supply.

The thermal dissipation holder 100 or the thermal dissipation holder 200 provided in the disclosure has a movable element 140, an elastic element 152, an elastic element 154, and a locker 160. Through the arrangement of the locker 160, the elastic element 152, and the elastic element 154, the user simply unlocks the movable element 140 and extends the movable element 140 outward automatically, which is convenient for the user to mount the thermal dissipation holder 100 and the thermal dissipation holder 200 on the handheld electronic device 20.

After the handheld electronic device 20 is placed and positioned, the user uses the locker to lock the movable element by only pressing the movable element 140, to mount the thermal dissipation holder 100 or the thermal dissipation holder 200 stably on the handheld electronic device 20 for operation. In this way, the problem that the traditional thermal dissipation holders are difficult to mount and easy to loose is resolved.

The above are only exemplary embodiments of the disclosure but do not limit the disclosure. Variations such as equivalent replacements or modifications in any form made by any person skilled in the art to the technical means and technical contents disclosed in the disclosure without departing from the technical means of the disclosure are contents not departing from the technical means of the disclosure and still fall within the protection scope of the disclosure.

What is claimed is:

1. A thermal dissipation holder, for a handheld electronic device, comprising:
    a main structure, having a front surface and a rear surface, wherein the rear surface has a carrier, and the carrier is applied to carry the handheld electronic device;
    a movable element, movably connected to the main structure along a first direction and having a clamp portion at a side away from the carrier;
    an elastic element, wherein one end of the elastic element is connected to the main structure, the other end of the elastic element is connected to the movable element, and the elastic element drives the movable element to move along the first direction; and
    a locker, disposed in the main structure and having a locking portion, wherein a position of the locking portion corresponds to that of the clamp portion, and the locker is selectively engaged with the clamp portion through the locking portion to lock the movable element,
    wherein the locking portion is movably disposed in the main structure along a second direction, and the second direction is perpendicular to the first direction.

2. The thermal dissipation holder according to claim 1, wherein the clamp portion comprises a locking opening, and the locking portion is coupled to the locking opening to lock the movable element.

3. The thermal dissipation holder according to claim 1, wherein the main structure has two slide grooves extending along the first direction, and the movable element comprises two sliding portions, sliding into the two slide grooves respectively.

4. The thermal dissipation holder according to claim 3, wherein the main structure further comprises a thermoelectric cooling chip disposed between the two slide grooves.

5. The thermal dissipation holder according to claim 1, further comprising a key movably disposed on the front surface along a third direction, wherein the key is coupled to the locker.

6. The thermal dissipation holder according to claim 5, wherein the key comprises an abutment surface for abutting against the locker to drive the locking portion to move away from the clamp portion.

7. The thermal dissipation holder according to claim 1, wherein the locker further comprises two elastic portions, and the two elastic portions are located at two sides of the locking portion to drive the locking portion to move toward the clamp portion.

8. The thermal dissipation holder according to claim 7, wherein the elastic portion is has a wavy structure.

9. The thermal dissipation holder according to claim 1, further comprising a support member pivotally connected to the carrier to switch between a folding position and a supporting position.

* * * * *